(12) United States Patent
Zeng (10) Patent No.: US 10,475,407 B2
(45) Date of Patent: Nov. 12, 2019

(54) GOA CIRCUIT AND DISPLAY DEVICE

(71) Applicant: Shenzhen China Star Optoelectronics Semiconductor Display Technology Co., Ltd., Shenzhen, Guangdong (CN)

(72) Inventor: Mian Zeng, Guangdong (CN)

(73) Assignee: Shenzhen China Star Optoelectronics Semiconductor Display Technology Co., Ltd, Shenzhen, Guangdong (CN)

( * ) Notice: Subject to any disclaimer, the term of this patent is extended or adjusted under 35 U.S.C. 154(b) by 101 days.

(21) Appl. No.: 15/739,776

(22) PCT Filed: Nov. 22, 2017

(86) PCT No.: PCT/CN2017/112288
§ 371 (c)(1),
(2) Date: Dec. 25, 2017

(87) PCT Pub. No.: WO2019/041585
PCT Pub. Date: Mar. 7, 2019

(65) Prior Publication Data
US 2019/0066616 A1 Feb. 28, 2019

(30) Foreign Application Priority Data
Aug. 29, 2017 (CN) .......................... 2017 1 0769978

(51) Int. Cl.
*G09G 3/36* (2006.01)
*G02F 1/1335* (2006.01)
(Continued)

(52) U.S. Cl.
CPC ....... *G09G 3/3677* (2013.01); *G02F 1/13454* (2013.01); *G02F 1/133514* (2013.01);
(Continued)

(58) Field of Classification Search
CPC .. G09G 3/3677; G09G 3/20; G09G 1/133514; G09G 1/13454; G09G 1/1368;
(Continued)

(56) References Cited

U.S. PATENT DOCUMENTS 6,177,831 B1 * 1/2001 Yoneda .................. G11C 5/146
327/537
9,443,458 B2 9/2016 Shang
(Continued)

FOREIGN PATENT DOCUMENTS

| CN | 106128401 A | 11/2016 |
|---|---|---|
| KR | 20150069787 A | 6/2015 |

*Primary Examiner* — Mark Edwards
(74) *Attorney, Agent, or Firm* — Andrew C. Cheng (57) ABSTRACT

A GOA circuit and a display device are provided. The GOA unit includes multiple GOA units, and each GOA unit includes a pull-up circuit for outputting a scanning driving signal of a current stage, a pull-down circuit including a first pull-down switch for pulling down the scanning driving signal of the current stage to a low voltage level, and a pull-down holding circuit including a first pull-down holding switch for holding the scanning driving signal of the current stage at a low voltage level. Each of the first pull-down switch and the first pull-down holding switch is a dual-gate TFT switch, a top gate electrode of each of the first pull-down switch and the first pull-down holding switch receives the first direct-current voltage. Accordingly, the present invention can reduce the current leakage, and increase the reliability of the entire GOA circuit.

10 Claims, 6 Drawing Sheets

(51) Int. Cl.
  *H01L 27/12*   (2006.01)
  *G02F 1/1345*  (2006.01)
  *G02F 1/1368*  (2006.01)

(52) U.S. Cl.
  CPC ........ *H01L 27/124* (2013.01); *H01L 27/1225* (2013.01); *H01L 27/1251* (2013.01); *G02F 1/1368* (2013.01); *G09G 2300/0408* (2013.01); *G09G 2310/08* (2013.01)

(58) Field of Classification Search
  CPC ... G09G 2300/0408; G09G 2300/0426; G09G 2310/0267; G09G 2310/0286; G09G 2310/08; H01L 27/1225; H01L 27/124; H01L 27/1251; G11C 19/28
  See application file for complete search history.

(56) References Cited

U.S. PATENT DOCUMENTS

| | | | |
|---|---|---|---|
| 2012/0206168 A1* | 8/2012 | Park | ............... H03K 19/20 327/108 |
| 2016/0042691 A1 | 2/2016 | Na | |
| 2016/0247476 A1* | 8/2016 | Xiao | ............... G09G 3/3677 |

\* cited by examiner

GOA CIRCUIT AND DISPLAY DEVICE

BACKGROUND OF THE INVENTION

1. Field of the Invention

The present invention relates to a display technology field, and more particularly to a GOA circuit and a display device.

2. Description of Related Art

For GOA (Gate Driver On Array) technology, that is, using a an array manufacturing process of a thin-film transistor (TFT, Thin Film Transistor) of a liquid crystal display to manufacture a row scanning signal circuit of Gate on an array substrate in order to realize a driving method of Gate scanning row-by-row.

The conventional GOA circuit includes multiple TFTs. After the TFT operates for a long time, the threshold voltage Vth is easily to offset, particularly, an IGZO (Indium Gallium Zinc Oxide) TFT. At a moment T0, for the IGZO TFT, the Vth can be less than 0, and a subthreshold swing (S factor) is smaller such that when a voltage between a gate electrode and a source electrode, that is Vgs, is equal to 0, a leakage current of the TFT will be very large such that GOA circuit is failed.

SUMMARY OF THE INVENTION

The technology problem mainly solved by the present invention is to provide a GOA circuit and a display device, which can control the Vth offset of the TFT in the GOA circuit, reduce the leakage current in order to increase the reliability of the entire GOA circuit.

In order to solve the above technology problem, one technology solution adopted by the present invention is: providing a GOA circuit including multiple cascaded GOA units, each GOA unit corresponds to a stage of a scanning line, and each GOA unit comprises: a pull-up circuit; a pull-up control circuit; a pull-down circuit; and a pull-down holding circuit; wherein the pull-up circuit is electrically connected to the pull-up control circuit, the pull-up control circuit provides a turning-on control signal to the pull-up circuit, the pull-up circuit outputs a scanning driving signal of a current stage to a scanning line of the current stage according to the turning-on control signal; wherein the pull-down circuit includes a first pull-down switch, the first pull-down switch receives a scanning driving signal of a next stage, and pulls down the scanning driving signal of the current stage to a low voltage level according to the scanning driving signal of the next stage; wherein the pull-down holding circuit includes a first pull-down holding switch, the first pull-down holding switch receives a pull-down holding signal, and holds the scanning driving signal of the current stage at a low voltage level according to the pull-down holding signal; wherein each of the first pull-down switch and the first pull-down holding switch is a dual-gate TFT switch, the dual-gate TFT switch includes a bottom gate electrode and a top gate electrode, wherein the top gate electrode receives a first direct-current voltage in order to control a threshold voltage offset of the dual-gate TFT switch; wherein a pull-up circuit includes a pull-up switch, a control terminal of the pull-up switch is electrically connected to the pull-up control circuit in order to receive the turning-on control signal, an input terminal of the pull-up switch receives an output clock signal, an output terminal of the pull-up switch outputs the scanning driving signal of the current stage; and wherein the pull-up control circuit includes a pull-up control switch, a control terminal of the pull-up control switch receives a transmission signal of a previous stage, an input terminal of the pull-up control switch receives a scanning driving signal of the previous stage, an output terminal of the pull-up control switch outputs the turning-on control signal, wherein, the transmission signal is a signal that delivers an operation status of the GOA unit of a current stage to the GOA unit of a next stage.

In order to solve the above technology problem, another technology solution adopted by the present invention is: providing a GOA circuit including multiple cascaded GOA units, each GOA unit corresponds to a stage of a scanning line, and each GOA unit comprises: a pull-up circuit; a pull-up control circuit; a pull-down circuit; and a pull-down holding circuit; wherein the pull-up circuit is electrically connected to the pull-up control circuit, the pull-up control circuit provides a turning-on control signal to the pull-up circuit, the pull-up circuit outputs a scanning driving signal of a current stage to a scanning line of the current stage according to the turning-on control signal; wherein the pull-down circuit includes a first pull-down switch, the first pull-down switch receives a scanning driving signal of a next stage, and pulls down the scanning driving signal of the current stage to a low voltage level according to the scanning driving signal of the next stage; wherein the pull-down holding circuit includes a first pull-down holding switch, the first pull-down holding switch receives a pull-down holding signal, and holds the scanning driving signal of the current stage at a low voltage level according to the pull-down holding signal; and wherein each of the first pull-down switch and the first pull-down holding switch is a dual-gate TFT switch, the dual-gate TFT switch includes a bottom gate electrode and a top gate electrode, wherein the top gate electrode receives a first direct-current voltage in order to control a threshold voltage offset of the dual-gate TFT switch.

In order to solve the above technology problem, another technology solution adopted by the present invention is: providing a display device, the display device includes an array substrate, and the array substrate includes the GOA circuit as illustrated above.

The beneficial effect of the present invention is: comparing to the conventional technology, the present invention provides a GOA circuit and a display device, the GOA circuit including multiple cascaded GOA units, each GOA unit corresponds to a stage of a scanning line, and each GOA unit comprises: a pull-up circuit; a pull-up control circuit; a pull-down circuit; and a pull-down holding circuit; wherein the pull-up circuit is electrically connected to the pull-up control circuit, the pull-up control circuit provides a turning-on control signal to the pull-up circuit, the pull-up circuit outputs a scanning driving signal of a current stage to a scanning line of the current stage according to the turning-on control signal; wherein the pull-down circuit includes a first pull-down switch, the first pull-down switch receives a scanning driving signal of a next stage, and pulls down the scanning driving signal of the current stage to a low voltage level according to the scanning driving signal of the next stage; wherein the pull-down holding circuit includes a first pull-down holding switch, the first pull-down holding switch receives a pull-down holding signal, and holds the scanning driving signal of the current stage at a low voltage level according to the pull-down holding signal; and wherein each of the first pull-down switch and the first pull-down holding switch is a dual-gate TFT switch, the dual-gate TFT switch includes a bottom gate electrode and a top gate electrode, wherein the top gate electrode receives a first direct-current voltage in order to control a threshold voltage offset of the dual-gate TFT switch. Accordingly, the present invention can control the Vth offset of the TFT in the GOA circuit, reduce the current leakage, and increase the reliability of the entire GOA circuit.

DETAILED DESCRIPTION OF THE PREFERRED EMBODIMENT

Figure 1:
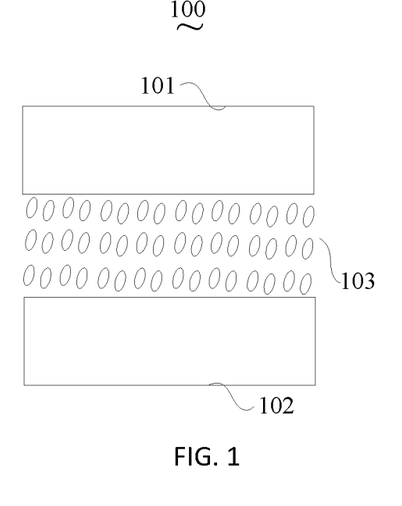
FIG. 1 is a schematic diagram of a display device provided by an embodiment of the present invention.

With reference to FIG. 1, FIG. 1 is a schematic diagram of a display device provided by an embodiment of the present invention. As shown in FIG. 1, the display device 100 of the present embodiment includes a color filter substrate 101, an array substrate 102 and a liquid crystal layer 103. Wherein, the color filter substrate 101 and the array substrate 102 are disposed oppositely, the liquid crystal layer 103 is disposed between the color filter substrate 101 and the array substrate 102.

Figure 2:
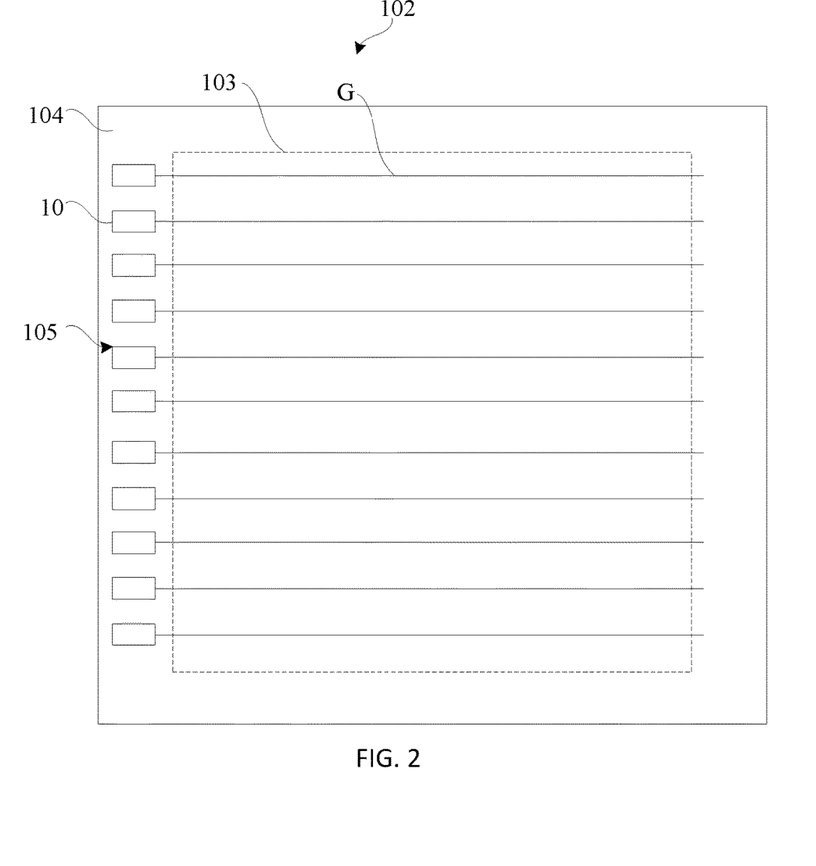
FIG. 2 is a schematic diagram of an array substrate provided by an embodiment of the present invention.

With further reference to FIG. 2, the array substrate 102 includes a display region 103 and a non-display region 104. Wherein, the display region 103 is provided with multiple scanning lines G for driving display switches. The non-display region 104 is provided with GOA circuit 105 for providing scanning driving signal for the scanning lines G. The GOA circuit of the present embodiment includes multiple cascaded GOA units 10. Each GOA unit 10 corresponds to a stage of a scanning line G. The structure of each GOA unit 10 is the same. The following content will use an N-th stage GOA unit as an example.

Figure 3:
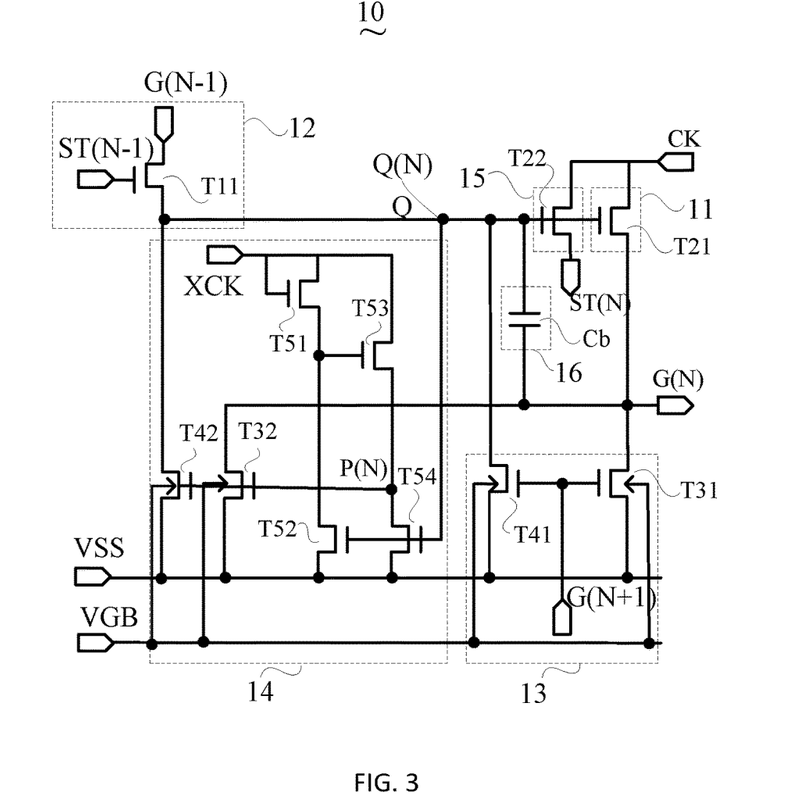
FIG. 3 is a schematic diagram of a GOA unit of a GOA circuit provided by an embodiment of the present invention.

With reference to FIG. 3, GOA unit 10 includes a pull-up circuit 11, a pull-up control circuit 12, a pull-down circuit 13 and a pull-down holding circuit 14.

Wherein, the pull-up circuit 11 is electrically connected to the pull-up control circuit 12. The pull-up control circuit 12 provides a turning-on control signal Q(N) to the pull-up circuit 11. The pull-up circuit 11 outputs a scanning driving signal G(N) of a current stage to a scanning line G of the current stage according to the turning-on control signal Q(N).

The pull-down circuit 13 includes a first pull-down switch T31, the first pull-down switch T31 receives a scanning driving signal G(N+1) of a next stage, and pulls down the scanning driving signal G(N) of the current stage to a low voltage level according to the scanning driving signal G(N+1) of the next stage.

The pull-down holding circuit 14 includes a first pull-down holding switch T32, the first pull-down holding switch T32 receives a pull-down holding signal P(N), and holds the scanning driving signal G(N) of the current stage at a low voltage level according to the pull-down holding signal P(N).

Figure 4:
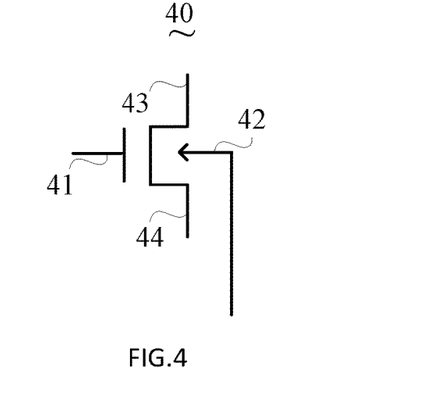
FIG. 4 is a schematic circuit diagram of a dual-gate TFT switch in the GOA unit shown in FIG. 3.
Figure 5:
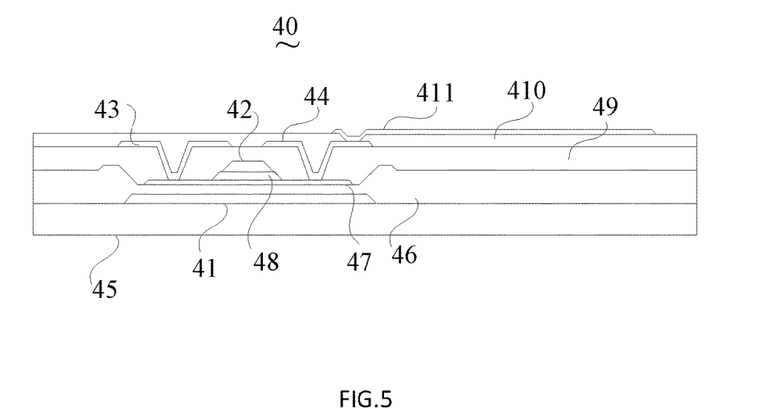
FIG. 5 is a schematic cross-sectional diagram of the dual-gate TFT switch in the GOA unit shown in FIG. 3.

Wherein, each of the first pull-down switch T31 and the first pull-down holding switch T32 is a dual-gate TFT switch. With reference to FIG. 4 and FIG. 5, FIG. 4 is a schematic diagram of a dual-gate TFT switch shown in FIG. 3. FIG. 5 is a schematic diagram of a cross-sectional structure of the dual-gate TFT switch shown in FIG. 3. As shown in FIG. 4 and FIG. 5, the dual-gate TFT switch 40 includes a bottom gate electrode 41, a top gate electrode 42 (also known as a back gate electrode), a source electrode 43 and a drain electrode 44. Wherein, the bottom gate electrode 41 is disposed on a glass substrate 45, a buffering insulation layer 46 is disposed on the bottom gate electrode 41, a semiconductor layer 47 is disposed on the buffering insulation layer 46 and a material of the semiconductor layer 47 is IGZO.

A gate insulation layer 48 is disposed on the semiconductor layer 47, a top gate electrode 42 is disposed on the gate insulation layer 48. An interlayer insulation layer 49 is disposed on the top gate electrode 42. A source electrode 43 and a drain electrode 44 are disposed on the interlayer insulation layer 49, and the source electrode 43 and the drain electrode 44 respectively pass through the interlayer insulation layer 49 to electrically connect to two terminals of the semiconductor layer 47. A planarization layer 410 is disposed on the source electrode 43 and the drain electrode 44. An ITO (Indium Tin Oxide) electrode 411 is disposed on the planarization layer 410, and the ITO electrode 411 passes through the planarization layer 410 to electrically connect to the drain electrode 44.

With reference to FIG. 3, in the present embodiment, the top gate electrode of each of the first pull-down switch T31 and the first pull-down holding switch T32 receives a first direct-current voltage VGB in order to control a threshold voltage offset Vth of the dual-gate TFT switch.

Therefore, the present embodiment can control the threshold voltage offset Vth of the dual-gate TFT switch only through the switch having a pull-down function such as disposing each of the first pull-down switch T31 and the first pull-down holding switch T32 as a dual-gate TFT switch, and providing a direct-current voltage VGB to the dual-gate TFT switch. Accordingly, the present invention can reduce a current leakage of the dual-gate TFT switch in order to increase a reliability of the GOA circuit, effectively controlling a pull-down of a current stage of the scanning driving signal G(N) in order to increase a yield rate of the array substrate 102. Besides, because the present embodiment does not add any element, the space for a layout of the circuit is not required in order to realize a narrow-frame design of the array substrate 102.

The following content will illustrate a specific structure and a relationship of each component of the circuit of GOA unit 10:

A pull-up circuit 11 includes a pull-up switch T21, a control terminal of the pull-up switch T21 is electrically connected to the pull-up control circuit 12. Specifically, the pull-up switch T21 is electrically connected to the pull-up control circuit 12 at a point Q in order to receive the turning-on control signal Q(N). An input terminal of the pull-up switch T21 receives an output clock signal CK, an output terminal of the pull-up switch T21 outputs the scanning driving signal G(N) of the current stage.

The pull-up control circuit 12 includes a pull-up control switch T11. A control terminal of the pull-up control switch T11 receives a transmission signal ST (N−1) of a previous stage. An input terminal of the pull-up control switch T11 receives a scanning driving signal G(N−1) of the previous stage. An output terminal of the pull-up control switch T11 outputs the turning-on control signal Q(N) to the point Q. Wherein, the transmission signal is a signal that delivers an operation status of the GOA unit of the current stage to the GOA unit of the next stage.

The pull-down circuit 13 further includes a second pull-down switch T41. The second pull-down switch T41 receives the scanning driving signal G(N+1) of the next stage, and pulls down the control signal Q(N) to a low voltage level according to the scanning driving signal G(N+1) of the next stage.

The pull-down holding circuit 14 further includes a second pull-down holding switch T42. The second pull-down holding switch T42 receives the pull-down holding signal P(N), and holds the turning-on control signal Q(N) at a low voltage level according to the pull-down holding signal P(N).

Wherein, each of the second pull-down switch T41 and the second pull-down holding switch T42 is a dual-gate TFT switch. A top gate electrode of each of the second pull-down switch T41 and the second pull-down holding switch T42 also receives the first direct-current voltage VGB.

Combining with the first pull-down switch T31 and the first pull-down holding switch T32 can obtain a specific structure and relationship of the pull-down circuit 13 and the pull-down holding circuit 14.

Specifically, a bottom gate electrode of each of the first pull-down switch T31 and the second pull-down switch T41 receives the scanning driving signal G(N+1) of the next stage. A top gate electrode of each of the first pull-down switch T31 and the second pull-down switch T41 receives the first direct-current voltage VGB. Source electrodes of the first pull-down switch T31 and the second pull-down switch T41 respectively receives the scanning driving signal G(N) and the turning-on control signal Q(N) of the current stage. Drain electrodes of the first pull-down switch T31 and the second pull-down switch T41 respectively receives the second direct-current voltage VSS. Wherein, the second direct-current voltage VSS is lower than the first direct-current voltage VGB. Specifically, the second direct-current voltage VSS is a ground voltage.

A bottom gate electrode of each of the first pull-down holding switch T32 and the second pull-down holding switch T42 receives the pull-down holding signal P(N). A top gate electrode of each of the first pull-down holding switch T32 and the second pull-down holding switch T42 receives the first direct-current voltage VGB. Source electrodes of the first pull-down holding switch T32 and the second pull-down holding switch T42 respectively receives the scanning driving signal G(N) and the turning-on control signal Q(N) of the current stage. Drain electrodes of the first pull-down holding switch T32 and the second pull-down holding switch T42 receives the second direct-current voltage VSS.

Accordingly, the switches used for providing a pull-down function of the turning-on control signal Q(N), that is, the second pull-down switch T41 and the second pull-down holding switch T42, also adopt the dual-gate TFT switch so that the pull-down of the turning-on control signal Q(N) can be effectively controlled.

Furthermore, the pull-down holding circuit 14 further includes a third pull-down holding switch T53, a fourth pull-down holding switch T51, a fifth pull-down holding switch T54 and a sixth pull-down holding switch T52.

Wherein, an input terminal of the third pull-down holding switch T53 and an input terminal and a control terminal of the fourth pull-down holding switch T51 receive a pull-down clock XCK. An output terminal of the fourth pull-down holding switch T51 is electrically connected to a control terminal of the third pull-down holding switch T53 and an input terminal of the sixth pull-down holding switch T52. An output terminal of the third pull-down holding switch T53 is electrically connected to the first pull-down holding switch T32, a bottom gate electrode of the second pull-down holding switch T42 and an input terminal of the fifth pull-down holding switch T54 in order to provide the pull-down holding signal P(N) to the first pull-down holding switch T32, the second pull-down holding switch T42 and the fifth pull-down holding switch T54.

A control terminal of the fifth pull-down holding switch T54 and a control terminal of the sixth pull-down holding switch T52 are connected to the point Q in order to receive the turning-on control signal Q(N). An output terminal of the fifth pull-down holding switch T54 and an output terminal of the sixth pull-down holding switch T52 receive the second direct-current voltage VSS.

Furthermore, the GOA unit 10 further includes a transmission circuit 15 and a bootstrap circuit 16. Wherein, the transmission circuit 15 includes a transmission switch T22. A control terminal of the transmission switch T22 is electrically connected to the point Q in order to receive the turning-on control signal Q(N). An input terminal of the transmission switch T22 receives an output clock signal CK. An output terminal of the transmission switch T22 outputs the transmission signal ST(N) to a GOA unit of the next stage.

The bootstrap circuit 16 includes a bootstrap capacitor Cb. Two terminals of the bootstrap capacitor Cb are respectively connected with the control terminal and the output terminal of the pull-up switch T21.

As described above all of the switches of the present embodiment is a TFT switch, wherein, the control terminal is a gate electrode of the TFT switch, an input terminal is a source electrode of the TFT switch, an output terminal is a drain electrode of the TFT switch.

The following will illustrate a driving principle of the GOA unit 10 of the present embodiment.

Figure 6:
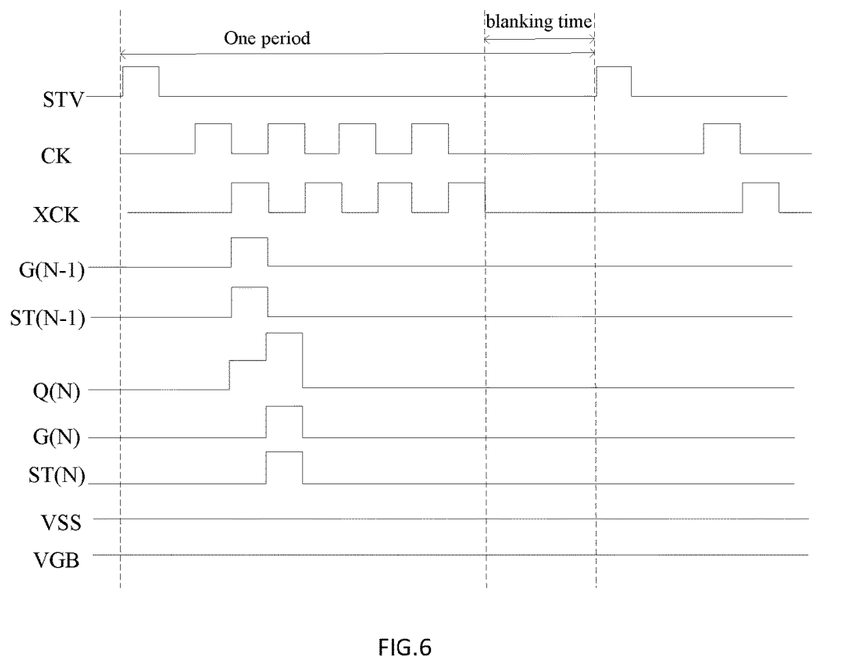
FIG. 6 is a schematic waveform diagram of driving signals in the GOA unit shown in FIG. 3.

With further reference to FIG. 6, FIG. 6 is a waveform diagram of each driving signal of the GIA unit shown in FIG. 3. As shown in FIG. 3 and FIG. 6, the pull-up circuit 11 mainly outputs the output clock signal (CK) to a scanning driving signal G(N) of the current stage. The pull-up control circuit 12 mainly controls a turn-on time of the pull-up circuit 11. Usually, the pull-up control circuit 12 is connected to a transmission signal ST(N−1) or the scanning driving signal G(N−1) delivered from the GOA unit of the previously stage. The pull-down circuit 13 mainly pulls down the scanning driving signal G(N) and the turning-on control signal Q(N) to a low voltage level at a first time. That is, turning off the scanning driving signal G(N) and the turning-on control signal Q(N) of the previous stage. The pull-down holding circuit 14 mainly holds the scanning driving signal G(N) and the turning-on control signal Q(N) at a turn-off status (that is, a negative voltage level). The bootstrap capacitor 16 is mainly used for pulling up the turning-on control signal Q(N) again, which is beneficial for outputting the scanning driving signal G(N) of the pull-up circuit 11 of the current stage. The transmission circuit 15 delivers a transmission signal ST(N) to the GOA unit 10 of the next stage in order to drive the GOA unit 10 of the next stage. The timing waveform diagram of the driving signals is shown in FIG. 6.

The driving signal shown in FIG. 6 is a high voltage driving. Wherein, the STV is a starting signal, that is, a starting signal of one picture frame. Specifically, after receiving the STV signal, if the pull-up control switch T11 of the pull-up control circuit 12 receives the transmission signal ST(N−1) and the scanning driving signal G(N−1) of the previous stage, the pull-up control switch T11 is turned on, and outputting the turn-on control signal Q(N). At this time, because the bootstrap capacitor is charged, the voltage level of the turning-on control signal Q(N) is lower, the pull-down switch T21 and the transmission switch T22 are not conductive. After the bootstrap capacitor finish charging, the voltage level of the point Q, that is, the voltage level of turning-on control signal Q(N) is increased such that the pull-down switch T21 and the transmission switch T22 are conductive. Accordingly, the scanning driving signal G(N) and the transmission signal ST(N) of the current stage are outputted.

A this time, the pull-down clock signal XCK is at a low voltage level, both of the third pull-down holding switch T53 and the fourth pull-down holding switch T51 are not conductive such that the first pull-down holding switch T32 and the second pull-down holding switch T42 are not conductive.

When a GOA unit of a next stage outputs a scanning driving signal G (N+1) of the next stage, the first pull-down switch T31 and the second pull-down switch T32 are conductive to respectively pull down the scanning driving signal G(N) and the turning-on control signal Q(N). At this time, the pull-down clock signal XCK becomes a high voltage level, the third pull-down holding switch T53 and the fourth pull-down holding switch T51 are conductive such that the first pull-down holding switch T32 and the second pull-down holding switch T42 are conductive. Accordingly, the scanning driving signal G(N) and the turning-on control signal Q(N) of the current stage can hold at a low voltage level.

Figure 7:
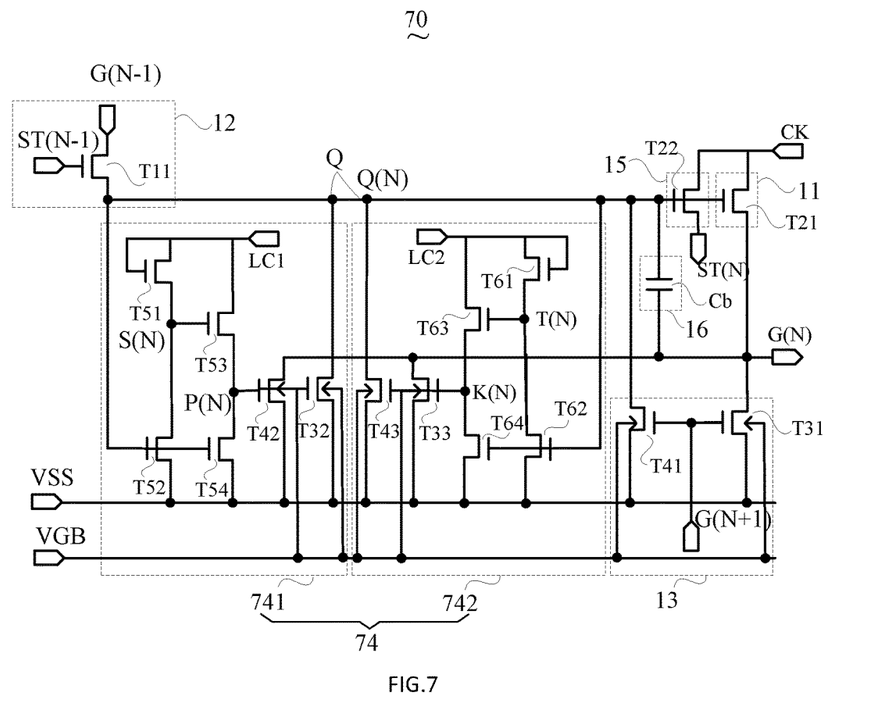
FIG. 7 is a schematic diagram of a GOA unit of another GOA circuit provided by an embodiment of the present invention.

The present embodiment further includes another GOA circuit, the specific structure is referred to FIG. 7.

As shown in FIG. 7, the difference between the GOA unit 70 of the present embodiment and the GOA unit 10 described above is that: the number of the pull-down holding circuit 74 of the GOA unit 70 is two, respectively, a pull-down holding circuit 741 and a pull-down holding circuit 742. Wherein, the connection relationship of the pull-down holding circuit 741 is the same as the pull-down holding circuit 14 described above, no more repeating. The pull-down holding circuits 741 and 742 have a mirror relationship. That is, the pull-down holding circuit 742 also includes a first pull-down holding switch T33, a second pull-down holding switch T43, a third pull-down holding switch T63, a fourth pull-down holding switch T61, a fifth pull-down holding switch T64 and a sixth pull-down holding switch T62. The structure and the relationship are the same as the first pull-down holding switch T32, the second pull-down holding switch T42, the third pull-down holding switch T53, the fourth pull-down holding switch T51, a fifth pull-down holding switch T54 and the sixth pull-down holding switch T52.

Wherein, the pull-down clock signal are two clock signals LC1 and LC2 having opposite waveforms, and respectively providing to different pull-down holding circuits 741 and 742. Specifically, the fourth pull-down holding switch T51 and T61 respectively receive pull-down clock signals LC1 and LC2.

Figure 8:
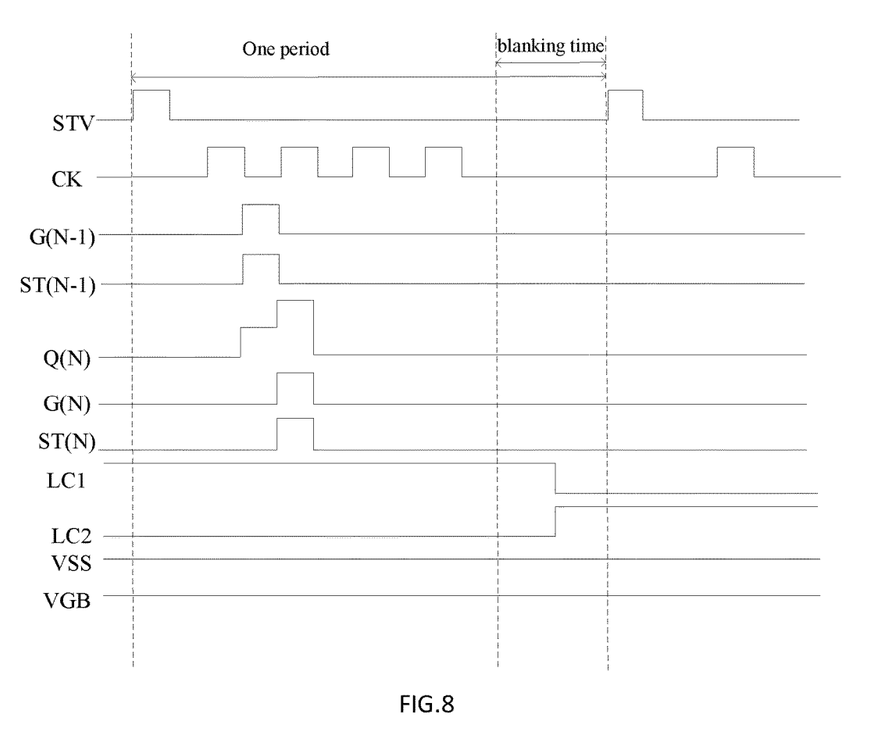
FIG. 8 is a schematic waveform diagram of driving signals in the GOA unit shown in FIG. 7.

In operation, a frequency of each of the pull-down clock signal LC1 and the pull0down clock signal LC2 is lower than an output clock signal CK inputted to the pull-up circuit 11, and make the pull-down holding signal K(N) and the P(N) to be at a high voltage level alternatively so that the two pull-down holding circuits 741 and 742 are operated alternately in order to reduce an adverse effect when the TFT transistors of the circuits 741 and 742 under a DC stress (direct-current stress) for a long time. The waveform diagram of each driving signal is shown in FIG. 8, the driving principle is similar as the driving principle illustrated above, no more repeating.

In summary, the present invention can control the threshold voltage offset Vth in order to reduce the current leakage of the dual-gate TFT switch so as to increase the reliability of the GOA circuit, and the yield rate of the array substrate 102. At the same time, the present invention does not add any element so that an additional space for circuit layout is not required in order to realize a narrow0frame design of the array substrate.

The above embodiments of the present invention are not used to limit the claims of this invention. Any use of the content in the specification or in the drawings of the present invention which produces equivalent structures or equivalent processes, or directly or indirectly used in other related technical fields is still covered by the claims in the present invention.

What is claimed is:

1. A GOA (Gate-on-Array) circuit including multiple cascaded GOA units, each GOA unit corresponds to a stage of a scanning line, and each GOA unit comprises:
    a pull-up circuit;
    a pull-up control circuit;
    a pull-down circuit; and
    a pull-down holding circuit;
    wherein the pull-up circuit is electrically connected to the pull-up control circuit, the pull-up control circuit provides a turning-on control signal to the pull-up circuit, the pull-up circuit outputs a scanning driving signal of a current stage to a scanning line of the current stage according to the turning-on control signal;
    wherein the pull-down circuit includes a first pull-down switch, the first pull-down switch receives a scanning driving signal of a next stage, and pulls down the scanning driving signal of the current stage to a low voltage level according to the scanning driving signal of the next stage;
    wherein the pull-down holding circuit includes a first pull-down holding switch, the first pull-down holding switch receives a pull-down holding signal, and holds the scanning driving signal of the current stage at a low voltage level according to the pull-down holding signal; and
    wherein each of the first pull-down switch and the first pull-down holding switch is a dual-gate TFT switch, the dual-gate TFT switch includes a bottom gate electrode and a top gate electrode, wherein the top gate electrode receives a first direct-current voltage in order to control a threshold voltage offset of the dual-gate TFT switch;
    wherein the pull-down circuit further includes a second pull-down switch, the second pull-down switch receives the scanning driving signal of the next stage, and pulls down the turning-on control signal to a low voltage level according to the scanning driving signal of the next stage;

the pull-down holding circuit further includes a second pull-down holding switch, the second pull-down holding switch receives the pull-down holding signal, and holds the turning-on control signal at a low voltage level according to the pull-down holding signal; and wherein each of the second pull-down switch and the second pull-down holding switch is a dual-gate TFT switch, a top gate electrode of each of the second pull-down switch and the second pull-down holding switch also receives the first direct-current voltage;

wherein a bottom gate electrode of each of the first pull-down switch and the second pull-down switch receives the scanning driving signal of the next stage, a top gate electrode of each of the first pull-down switch and the second pull-down switch receives the first direct-current voltage, source electrodes of the first pull-down switch and the second pull-down switch respectively receives the scanning driving signal and the turning-on control signal of the current stage, drain electrodes of the first pull-down switch and the second pull-down switch respectively receives a second direct-current voltage;

wherein a bottom gate electrode of each of the first pull-down holding switch and the second pull-down holding switch receives the pull-down holding signal, a top gate electrode of each of the first pull-down holding switch and the second pull-down holding switch receives the first direct-current voltage, source electrodes of the first pull-down holding switch and the second pull-down holding switch respectively receives the scanning driving signal and the turning-on control signal of the current stage, and drain electrodes of the first pull-down holding switch and the second pull-down holding switch receives the second direct-current voltage;

wherein the pull-down holding circuit further includes a third pull-down holding switch, a fourth pull-down holding switch, a fifth pull-down holding switch and a sixth pull-down holding switch;

wherein, an input terminal of the third pull-down holding switch and an input terminal and a control terminal of the fourth pull-down holding switch receive a pull-down clock, an output terminal of the fourth pull-down holding switch is electrically connected to a control terminal of the third pull-down holding switch and an input terminal of the sixth pull-down holding switch, an output terminal of the third pull-down holding switch is electrically connected to the first pull-down holding switch, a bottom gate electrode of the second pull-down holding switch and an input terminal of the fifth pull-down holding switch; and a control terminal of the fifth pull-down holding switch and a control terminal of the sixth pull-down holding switch receive the turning-on control signal, an output terminal of the fifth pull-down holding switch and an output terminal of the sixth pull-down holding switch receive the second direct-current voltage.

2. The GOA circuit according to claim 1, wherein the pull-up circuit includes a pull-up switch, a control terminal of the pull-up switch is electrically connected to the pull-up control circuit in order to receive the turning-on control signal, an input terminal of the pull-up switch receives an output clock signal, an output terminal of the pull-up switch outputs the scanning driving signal of the current stage.

3. The GOA circuit according to claim 1, wherein the pull-up control circuit includes a pull-up control switch, a control terminal of the pull-up control switch receives a transmission signal of a previous stage, an input terminal of the pull-up control switch receives a scanning driving signal of the previous stage, an output terminal of the pull-up control switch outputs the turning-on control signal, wherein, the transmission signal is a signal that delivers an operation status of the GOA unit of a current stage to the GOA unit of a next stage.

4. The GOA circuit according to claim 1, wherein the pull-down holding circuits are two, and the pull-down clock signal are two clock signals having opposite waveforms, and respectively providing to different pull-down holding circuits.

5. The GOA circuit according to claim 2, wherein the GOA unit further includes a transmission circuit and a bootstrap circuit; wherein, the transmission circuit includes a transmission switch, a control terminal of the transmission switch receive the turning-on control signal, an input terminal of the transmission switch receives an output clock signal, an output terminal of the transmission switch outputs the transmission signal to a GOA unit of the next stage; and wherein the bootstrap circuit includes a bootstrap capacitor, two terminals of the bootstrap capacitor are respectively connected with the control terminal and the output terminal of the pull-up switch.

6. A display device including an array substrate, the array substrate including a GOA (Gate-on-Array) circuit, the GOA circuit including multiple cascaded GOA units, each GOA unit corresponds to a stage of a scanning line, and each GOA unit comprises:

a pull-up circuit;
a pull-up control circuit;
a pull-down circuit; and
a pull-down holding circuit;

wherein the pull-up circuit is electrically connected to the pull-up control circuit, the pull-up control circuit provides a turning-on control signal to the pull-up circuit, the pull-up circuit outputs a scanning driving signal of a current stage to a scanning line of the current stage according to the turning-on control signal; wherein the pull-down circuit includes a first pull-down switch, the first pull-down switch receives a scanning driving signal of a next stage, and pulls down the scanning driving signal of the current stage to a low voltage level according to the scanning driving signal of the next stage;

wherein the pull-down holding circuit includes a first pull-down holding switch, the first pull-down holding switch receives a pull-down holding signal, and holds the scanning driving signal of the current stage at a low voltage level according to the pull-down holding signal; and wherein each of the first pull-down switch and the first pull-down holding switch is a dual-gate TFT switch, the dual-gate TFT switch includes a bottom gate electrode and a top gate electrode, wherein the top gate electrode receives a first direct-current voltage in order to control a threshold voltage offset of the dual-gate TFT switch;

wherein the pull-down circuit further includes a second pull-down switch, the second pull-down switch receives the scanning driving signal of the next stage, and pulls down the turning-on control signal to a low voltage level according to the scanning driving signal of the next stage;

the pull-down holding circuit further includes a second pull-down holding switch, the second pull-down holding switch receives the pull-down holding signal, and holds the turning-on control signal at a low voltage level according to the pull-down holding signal; and wherein each of the second pull-down switch and the second pull-down holding switch is a dual-gate TFT switch, a top gate electrode of each of the second pull-down switch and the second pull-down holding switch also receives the first direct-current voltage;

wherein a bottom gate electrode of each of the first pull-down switch and the second pull-down switch receives the scanning driving signal of the next stage, a top gate electrode of each of the first pull-down switch and the second pull-down switch receives the first direct-current voltage, source electrodes of the first pull-down switch and the second pull-down switch respectively receives the scanning driving signal and the turning-on control signal of the current stage, drain electrodes of the first pull-down switch and the second pull-down switch respectively receives a second direct-current voltage;

wherein a bottom gate electrode of each of the first pull-down holding switch and the second pull-down holding switch receives the pull-down holding signal, a top gate electrode of each of the first pull-down holding switch and the second pull-down holding switch receives the first direct-current voltage, source electrodes of the first pull-down holding switch and the second pull-down holding switch respectively receives the scanning driving signal and the turning-on control signal of the current stage, and drain electrodes of the first pull-down holding switch and the second pull-down holding switch receives the second direct-current voltage;

wherein the pull-down holding circuit further includes a third pull-down holding switch, a fourth pull-down holding switch, a fifth pull-down holding switch and a sixth pull-down holding switch;

wherein, an input terminal of the third pull-down holding switch and an input terminal and a control terminal of the fourth pull-down holding switch receive a pull-down clock, an output terminal of the fourth pull-down holding switch is electrically connected to a control terminal of the third pull-down holding switch and an input terminal of the sixth pull-down holding switch, an output terminal of the third pull-down holding switch is electrically connected to the first pull-down holding switch, a bottom gate electrode of the second pull-down holding switch and an input terminal of the fifth pull-down holding switch; and a control terminal of the fifth pull-down holding switch and a control terminal of the sixth pull-down holding switch receive the turning-on control signal, an output terminal of the fifth pull-down holding switch and an output terminal of the sixth pull-down holding switch receive the second direct-current voltage.

7. The display device according to claim 6, wherein the pull-up circuit includes a pull-up switch, a control terminal of the pull-up switch is electrically connected to the pull-up control circuit in order to receive the turning-on control signal, an input terminal of the pull-up switch receives an output clock signal, an output terminal of the pull-up switch outputs the scanning driving signal of the current stage.

8. The display device according to claim 6, wherein the pull-up control circuit includes a pull-up control switch, a control terminal of the pull-up control switch receives a transmission signal of a previous stage, an input terminal of the pull-up control switch receives a scanning driving signal of the previous stage, an output terminal of the pull-up control switch outputs the turning-on control signal, wherein, the transmission signal is a signal that delivers an operation status of the GOA unit of a current stage to the GOA unit of a next stage.

9. The display device according to claim 6, wherein the pull-down holding circuits are two, and the pull-down clock signal are two clock signals having opposite waveforms, and respectively providing to different pull-down holding circuits.

10. The display device according to claim 7, wherein the GOA unit further includes a transmission circuit and a bootstrap circuit;

wherein, the transmission circuit includes a transmission switch, a control terminal of the transmission switch receive the turning-on control signal, an input terminal of the transmission switch receives an output clock signal, an output terminal of the transmission switch outputs the transmission signal to a GOA unit of the next stage; and wherein the bootstrap circuit includes a bootstrap capacitor, two terminals of the bootstrap capacitor are respectively connected with the control terminal and the output terminal of the pull-up switch.

* * * * *